(12) United States Patent
Giffel

(10) Patent No.: US 8,438,530 B2
(45) Date of Patent: May 7, 2013

(54) CONNECTION NAVIGATION IN ELECTRONIC DESIGN AUTOMATION

(75) Inventor: Barry A. Giffel, Wake Forest, NC (US)

(73) Assignee: Synopsys, Inc., Mountain View, CA (US)

( * ) Notice: Subject to any disclaimer, the term of this patent is extended or adjusted under 35 U.S.C. 154(b) by 399 days.

(21) Appl. No.: 12/609,944

(22) Filed: Oct. 30, 2009

(65) Prior Publication Data

US 2011/0023006 A1    Jan. 27, 2011

Related U.S. Application Data

(60) Provisional application No. 61/227,712, filed on Jul. 22, 2009.

(51) Int. Cl.
*G06F 15/04* (2006.01)
*G06F 17/50* (2006.01)

(52) U.S. Cl.
USPC .......................................................... 716/139

(58) Field of Classification Search ................... 716/139
See application file for complete search history.

(56) References Cited

U.S. PATENT DOCUMENTS

| | | | |
|---|---|---|---|
| 5,392,222 A * | 2/1995 | Noble ............................. | 716/52 |
| 5,555,201 A * | 9/1996 | Dangelo et al. ............... | 716/102 |
| 5,610,828 A * | 3/1997 | Kodosky et al. .............. | 716/139 |
| 6,240,541 B1 * | 5/2001 | Yasuda et al. ................. | 716/112 |
| 6,321,370 B1 * | 11/2001 | Suzuki et al. ................. | 716/122 |
| 7,376,922 B2 * | 5/2008 | Rushing et al. ............... | 716/119 |
| 7,802,221 B1 * | 9/2010 | Brink et al. .................... | 716/121 |
| 7,813,914 B1 * | 10/2010 | Allen et al. ..................... | 703/25 |
| 7,992,119 B1 * | 8/2011 | Iotov et al. .................... | 716/119 |
| 2002/0042904 A1 * | 4/2002 | Ito et al. ............................ | 716/8 |
| 2004/0025133 A1 * | 2/2004 | Koford et al. ................... | 716/12 |
| 2005/0071787 A1 * | 3/2005 | Koga et al. ........................ | 716/1 |
| 2005/0071795 A1 * | 3/2005 | Rushing et al. ................. | 716/11 |
| 2006/0095882 A1 * | 5/2006 | Mankin et al. .................. | 716/11 |
| 2006/0101368 A1 * | 5/2006 | Kesarwani et al. ............. | 716/11 |
| 2007/0050745 A1 * | 3/2007 | Dinter et al. .................... | 716/11 |
| 2008/0115102 A1 * | 5/2008 | Rittman .......................... | 716/19 |

* cited by examiner

Primary Examiner — Suresh Memula
(74) Attorney, Agent, or Firm — Park, Vaughan, Fleming & Dowler, LLP; Laxman Sahasrabuddhe

(57) ABSTRACT

Some embodiments provide a system that facilitates the creation of a design in an electronic design automation (EDA) application. During operation, the system obtains a set of parameters associated with parameterized connections in a hierarchy of the design and a set of net assignments to the parameters. Next, the system displays the parameters and the net assignments to a user of the EDA application through a graphical user interface (GUI) associated with the EDA application. Finally, the system enables modifications to the net assignments by the user through the GUI.

22 Claims, 5 Drawing Sheets

CONNECTION NAVIGATION IN ELECTRONIC DESIGN AUTOMATION

RELATED APPLICATIONS

This application claims priority to U.S. Provisional Application No. 61/227,712, entitled "Connection Navigator," by Barry Andrew Giffel, filed 22 Jul. 2009, the contents of which are herein incorporated by reference.

BACKGROUND

1. Field

This disclosure relates to electronic design automation (EDA). More specifically, this disclosure relates to techniques for centralized display and management of parameters and assignments associated with a hierarchy of a design.

2. Related Art

Integrated circuit design often involves the use of schematics, which typically contain logical representations of components and wires in integrated circuits. EDA tools are typically used for creating schematics. For example, a schematic editor may allow a designer to create an electronic schematic of an integrated circuit. The electronic schematic may then be used by other EDA tools to simulate the operation of the integrated circuit, create a layout of the integrated circuit, and/or detect errors in the schematic.

EDA tools may further allow for the hierarchical design of integrated circuits, in which portions of large designs may be divided into manageable subsections that are created, represented symbolically, designed, and connected. Each component in a schematic may be designed as a master in a lower level of the hierarchy and reused as one or more instances in a higher level of the hierarchy. In addition, changes to the master may be reflected in each instance. Such centralized design and reuse of components may allow for parallel development of subsections of large designs, quick propagation of changes to the components throughout the schematic, and increased capacity of the schematic.

Consequently, integrated circuit design may be facilitated by maximizing the centralized design and management of components and interconnections within schematics.

SUMMARY

Some embodiments provide a system that facilitates the creation of a design in an electronic design automation (EDA) application. During operation, the system obtains a set of parameters associated with parameterized connections in a hierarchy of the design and a set of net assignments to the parameters. Next, the system displays the parameters and the net assignments to a user of the EDA application through a graphical user interface (GUI) associated with the EDA application. Finally, the system enables modifications to the net assignments by the user through the GUI.

In some embodiments, obtaining the parameters and the assignments involves retrieving connection definition information for the design based at least on the hierarchy, wherein the connection definition information comprises the parameters and the net assignments.

In some embodiments, each of the parameters is associated with one or more cell instances, and a cell instance from the cell instances is electrically connected to a net if the cell instance contains a net assignment of one of the parameters to the net.

In some embodiments, displaying the parameters and the net assignments through the GUI involves displaying a first list of the parameters in the hierarchy and displaying a second list of the net assignments based at least on a selection of a parameter from the parameters through the GUI.

In some embodiments, displaying the second list of the net assignments based at least on the selection of the parameter involves displaying a subset of the cell instances and a subset of the net assignments associated with the parameter if the parameter is selected, and displaying all of the cell instances and all of the net assignments if none of the parameters is selected.

In some embodiments, displaying the second list of the net assignments based at least on the selection of the parameter involves setting a background color or a font style of each net assignment from the net assignments based at least on an assignment state of the parameter.

In some embodiments, the assignment state of the parameter is one of:
(i) empty, wherein the parameter is not assigned for any component in the cell instance;
(ii) partially assigned, wherein the parameter is assigned for some components in the cell instance; and
(iii) fully assigned, wherein the parameter is assigned for all components associated with the parameter in the cell instance.

BRIEF DESCRIPTION OF THE FIGURES

The patent or application file contains at least one drawing executed in color. Copies of this patent or patent application publication with color drawing(s) will be provided by the Office upon request and payment of the necessary fee.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
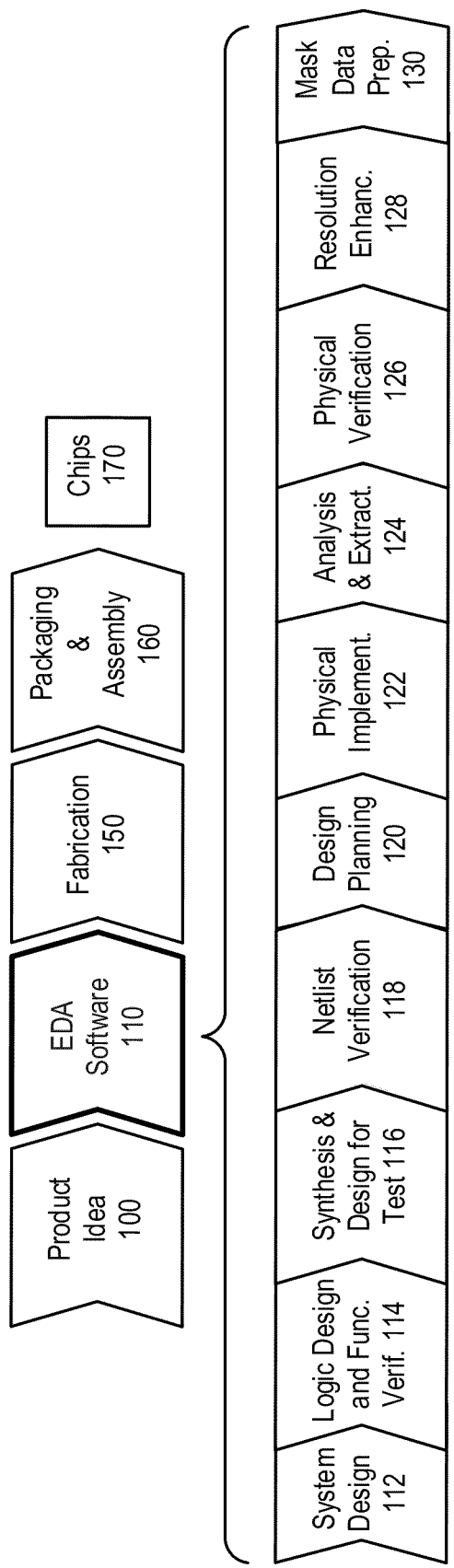
FIG. 1 shows a workflow associated with the design and fabrication of an integrated circuit in accordance with an embodiment.

FIG. 1 shows a workflow associated with the design and fabrication of an integrated circuit in accordance with an embodiment. The workflow may begin with a product idea (step 100), which may be realized using an integrated circuit that is designed using an electronic design automation (EDA) process (step 110). After the integrated circuit design is finalized, the design may undergo a fabrication process (step 150) and a packaging and assembly process (step 160) to produce chips 170.

The EDA process (step 110) includes steps 112-130, which are described below for illustrative purposes only and are not meant to limit the present invention. Specifically, the steps may be performed in a different sequence than the sequence described below.

During system design (step 112), circuit designers may describe the functionality to be implemented in the integrated circuit. They may also perform what-if planning to refine functionality, check costs, etc. Hardware-software architecture partitioning may also occur at this stage. Exemplary EDA software products from Synopsys, Inc. that may be used at this step include Model Architect, Saber®, System Studio, and DesignWare®.

During logic design and functional verification (step 114), the VHDL or Verilog code for modules in the system may be written and the design may be checked for functional accuracy, (e.g., the design may be checked to ensure that it produces the correct outputs). Exemplary EDA software products from Synopsys, Inc. that may be used at this step include VCS®, Vera®, DesignWare®, Magellan™, Formality®, ESP and Leda®.

During synthesis and design for test (step 116), the VHDL/Verilog may be translated to a netlist. Further, the netlist may be optimized for the target technology, and tests may be designed and implemented to check the finished chips. Exemplary EDA software products from Synopsys, Inc. that may be used at this step include Design Compiler®, Physical Compiler®, Test Compiler, Power Compiler™, FPGA Compiler, TetraMAX®, and DesignWare®.

During netlist verification (step 118), the netlist may be checked for compliance with timing constraints and for correspondence with the VHDL/Verilog source code. Exemplary EDA software products from Synopsys, Inc. that may be used at this step include Formality®, PrimeTime®, and VCS®.

During design planning (step 120), an overall floorplan for the chip may be constructed and analyzed for timing and top-level routing. Exemplary EDA software products from Synopsys, Inc. that may be used at this step include Astro™ and IC Compiler products.

During physical implementation (step 122), circuit elements may be positioned in the layout (placement) and may be electrically coupled (routing). Exemplary EDA software products from Synopsys, Inc. that may be used at this step include Astro™ and IC Compiler products.

During analysis and extraction (step 124), the circuit's functionality may be verified at a transistor level and parasitics may be extracted. Exemplary EDA software products from Synopsys, Inc. that may be used at this step include AstroRail™, PrimeRail, PrimeTime®, and Star-RCXT™.

During physical verification (step 126), the design may be checked to ensure correctness for manufacturing, electrical issues, lithographic issues, and circuitry. Hercules™ is an exemplary EDA software product from Synopsys, Inc. that may be used at this step.

During resolution enhancement (step 128), geometric manipulations may be performed on the layout to improve manufacturability of the design. Exemplary EDA software products from Synopsys, Inc. that may be used at this step include Proteus/ProGen, ProteusAF, and PSMGen.

During mask data preparation (step 130), the design may be "taped-out" to produce masks that are used during fabrication.

Figure 2:
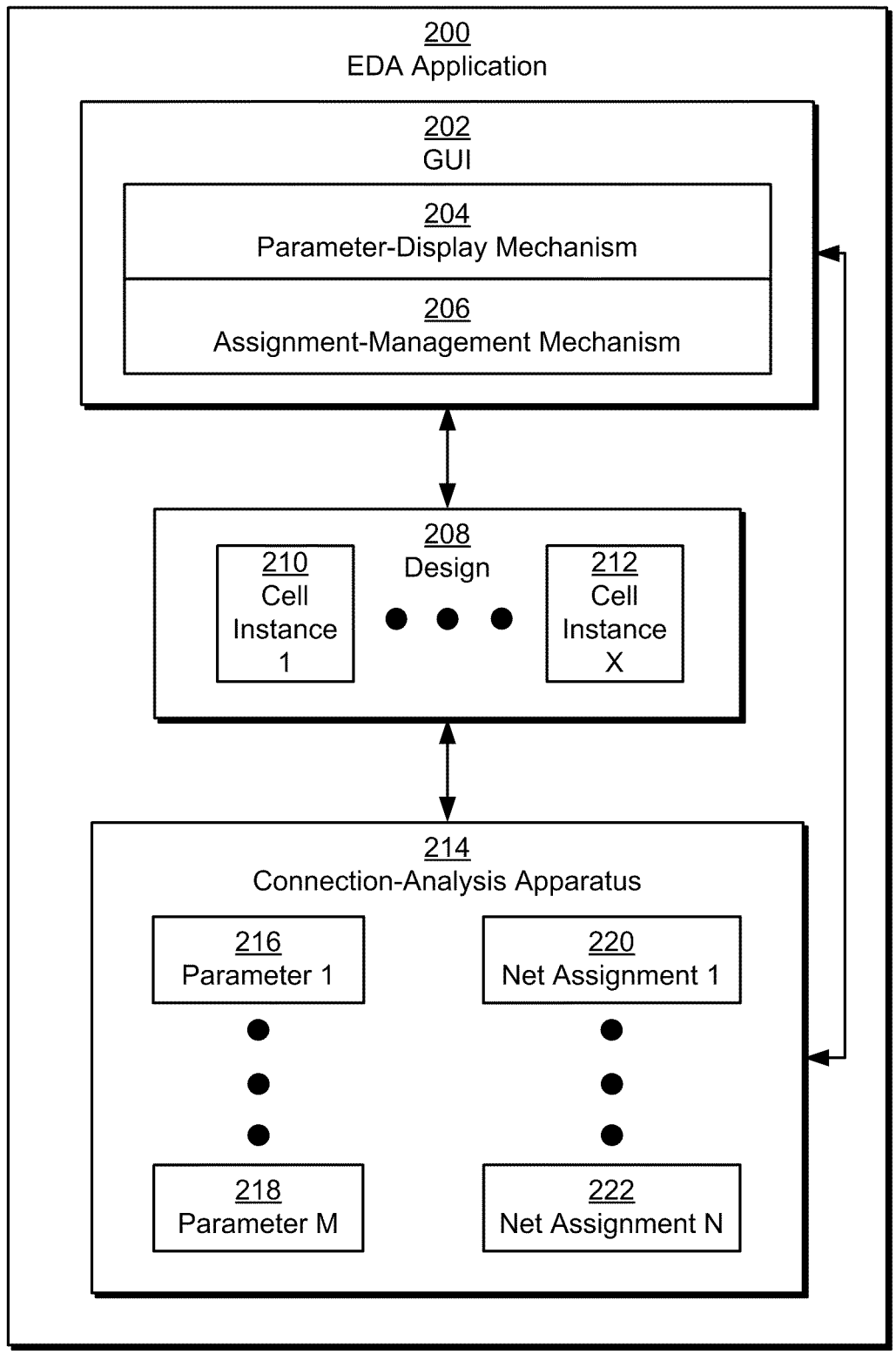
FIG. 2 shows an electronic design automation (EDA) application in accordance with an embodiment.

FIG. 2 shows an EDA application 200 in accordance with an embodiment. As shown in FIG. 2, EDA application 200 includes a graphical user interface (GUI) 202, a design 208, and a connection-analysis apparatus 214. Each of these components is described in further detail below.

Design 208 may correspond to an abstract representation of an integrated circuit that uses graphical objects to represent components in the integrated circuit. For example, design 208 may correspond to an OpenAccess design or a schematic. Design 208 may contain symbols that represent resistors, capacitors, transistors, logic gates, and/or other components in the integrated circuit. The graphical objects may additionally be connected by lines that represent power and signal connections between the components. In other words, the functionality of the integrated circuit may be illustrated by the components and interconnections within design 208.

Design 208 may be created using EDA application 200. For example, EDA application 200 may correspond to a schematic editor that allows a user to create design 208 on a computer system. Moreover, EDA application 200 may allow design 208 to be created hierarchically. In particular, design 208 may include a hierarchy of levels. Lower levels of the hierarchy may contain low-level cells (e.g., components) such as transistors and gates, while higher levels of the hierarchy may contain cells that are built using the low-level cells.

Hierarchical design mechanisms in EDA application 200 may allow the user to create individual cells in design 208 as masters in lower levels of the hierarchy. The components may then be reused as cell instances (e.g., cell instance 1 210, cell instance x 212) in higher levels of the hierarchy. Furthermore, changes to a master may be propagated to each cell instance of the master in design 208. For example, a transistor and a gate may be designed as masters at the bottom of the hierarchy. A master of an inverter may then be created from the transistor and gate at the next level of the hierarchy, and a master of a buffer may be created from two inverters at the level above that of the inverter's. Changes to the master of the transistor may thus be propagated to cell instances of the transistor within the inverter, buffer, and/or other cells containing the transistor.

Cell connectivity in design 208 may also be hierarchical. Each cell instance may include one or more parameterized connections that are associated with nets and/or terminals (e.g., ports, pins, etc.) in the cell instance. To connect the cell instance to a net, a parameter representing a terminal in the cell may be assigned to the net. The parameter may contain a default net assignment if the parameter in the master is assigned. Moreover, the net assignment may be explicitly assigned in cell instances of the master to remove the default net assignment from the cell instances. For example, a master of a transistor may include a parameter named "bulk" with a default net assignment to a net named "gnd." Cell instances of the transistor may thus include a net assignment of the "bulk" parameter to the "gnd" net. However, a cell instance of the transistor may include a different net assignment of the "bulk" parameter to the "vdd" net if the net assignment is explicit. In other words, individual cell instances within design 208 may be connected to different nets by explicitly assigning a parameter in each cell instance to the name of the corresponding net.

Furthermore, terminals in lower levels of the hierarchy may be represented using invisible terminals in higher levels of the hierarchy. For example, the "bulk" terminal in the transistor may be an invisible terminal in an inverter containing the transistor. Consequently, the "bulk" parameter may be assigned at the transistor level and at the inverter level, as well as at other levels of the hierarchy containing cell instances of the transistor. Because the "bulk" parameter refers to the "bulk" terminal in the transistor, a net assignment at any level in the hierarchy may ultimately affect the "bulk" terminal in cell instances of the transistor.

However, the user may have difficulty managing parameterized connections in multiple levels of hierarchy within design 208. In particular, the user may be unable to centrally view and manage parameterized connections from different levels of the hierarchy of design 208 using conventional EDA tools. Instead, the user may be required to manually search the hierarchy of design 208 to locate and modify net assignments in specific cell instances. For example, the user may change a net assignment in a cell instance by locating the cell instance within the hierarchy, obtaining cell data for the cell distance, and modifying the cell data to reflect the change.

To facilitate the development of design 208, EDA application 200 may include functionality to consolidate and organize data related to connectivity in design 208. In particular, connection-analysis apparatus 214 may obtain hierarchical connection definition information associated with the parameterized connections from design 208. EDA application 200 may then display and enable changes to the connection definition information through GUI 202.

As shown in FIG. 2, connection-analysis apparatus 214 includes a set of parameters (e.g., parameter 1 216, parameter m 218) and a set of net assignments (e.g., net assignment 1 220, net assignment n 222). As described above, the parameters may represent parameterized connections (e.g., terminals) in cell instances within design 208, while the net assignments may contain values that represent nets connected to the cell instances. In other words, connection-analysis apparatus 214 may retrieve connection definition information for design 208 as the parameters and net assignments.

In one or more embodiments, the parameters and net assignments obtained by connection-analysis apparatus 214 are associated with the hierarchy of design 208. For example, connection-analysis apparatus 214 may retrieve connection definition information from design 208 as the parameters and net assignments associated with a specific level of the hierarchy. Furthermore, the user may navigate through the hierarchy by changing the level used by connection-analysis apparatus 214 to retrieve the parameters and net assignments. In other words, the user may manage connectivity in design 208 by requesting connection definition information associated with different levels of the hierarchy using EDA application (e.g., through GUI 202).

The parameters and assignments may then be displayed to the user through GUI 202. In particular, a parameter-display mechanism 204 in GUI 202 may display a first list of the parameters, while an assignment-management mechanism 206 in GUI 202 may display a second list of the net assignments. In addition, the display of net assignments within assignment-management mechanism 206 may be based at least on the user's selection of one or more parameters in parameter-display mechanism 204. In other words, the display of net assignments in assignment-management mechanism 206 may be based on one or more factors that include the selection of one or more parameters in parameter-display mechanism 204. If a parameter is selected within parameter-display mechanism 204, assignment-management mechanism 206 may display a subset of the cell instances and a subset of the net assignments associated with the parameter. If no parameter is selected, assignment-management mechanism 206 may display all of the cell instances and all of the net assignments.

In one or more embodiments, assignment-management mechanism 206 sets a background color or a font style of each net assignment based at least on an assignment state of the parameter associated with the net assignment. The assignment state of the parameter may be empty, in which the parameter is not assigned for any component (e.g., lower-level cell instance) in the cell instance; partially assigned, in which the parameter is assigned for some components in the cell instance; or fully assigned, in which the parameter is assigned for all components associated with the parameter in the cell instance.

Assignment-management mechanism 206 may additionally enable modifications to the net assignments by the user through GUI 202. For example, assignment-management mechanism 206 may include editable fields that allow the user to change the net assignments by updating the values in the editable fields. Parameter-display mechanism 204 and assignment-management mechanism 206 are discussed in further detail below with respect to FIG. 3.

Figure 3:
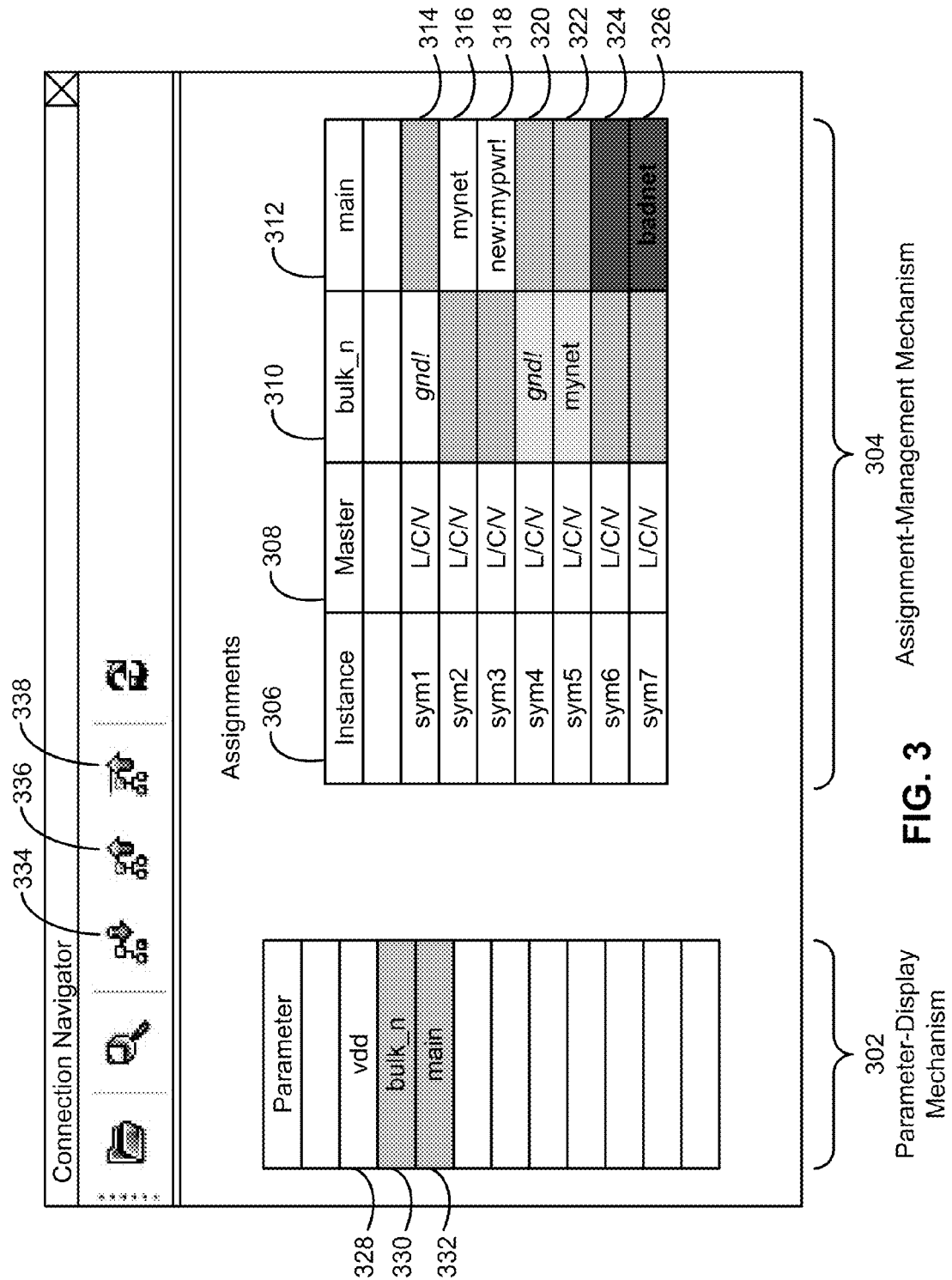
FIG. 3 shows an exemplary screenshot in accordance with an embodiment.

FIG. 3 shows an exemplary screenshot in accordance with an embodiment. More specifically, FIG. 3 shows a screenshot of a GUI for an EDA application, such as GUI 202 of FIG. 2. The GUI of FIG. 3 may allow a user of the EDA application to view and edit connection definition information for a design, such as design 208 of FIG. 2. The GUI includes a parameter-display mechanism 302 and an assignment-management mechanism 304.

Parameter-display mechanism 302 displays a list of parameters 328-332 (e.g., "vdd," "bulk_n," "main") associated with a hierarchy of the design. In particular, parameters 328-332 may correspond to parameterized connections in cell instances at a given level of the hierarchy, as well as parameterized connections in components within the cell instances. For example, parameter-display mechanism 302 may show parameters 328-332 associated with a buffer in the hierarchy. Consequently, parameters 328-332 may be located in the buffer's level of the hierarchy, in a set of inverters at a level below the buffer's, and/or in a set of transistors and gates at the lowest level of the hierarchy. However, parameters that exist at higher levels of the hierarchy than those of the buffer's may not be displayed because such parameters are external to the buffer.

Assignment-management mechanism 304 includes a table with four columns 306-312 and seven rows 314-326 of data. Each column may correspond to a different type of data, while each row may represent a different cell instance in the current level of the hierarchy associated with parameters 328-332. Column 306 (e.g., "Instance") may display the names of the cell instances, from "sym1" to "sym7." Column 308 (e.g., "Master") may display the identifying library, cell, and view of the master of each cell instance. For example, the user may select the last row of column 308 using a pointer (e.g., cursor), keyboard, and/or other input device to change the GUI's view of the hierarchy to the level containing the master of the "sym7" cell instance.

As shown in FIG. 3, parameters 330-332 (e.g., "bulk_n," "main") are selected in parameter-display mechanism 302, while parameter 328 (e.g., "vdd") is not. The selection of parameters 330-332 in parameter-display mechanism 302 may be reflected in the display of cell instances and net assignments in assignment-management mechanism 304. In particular, column 310 (e.g., "bulk_n") shows net assignments to parameter 330, while column 312 (e.g., "main") shows net assignments to parameter 332. Furthermore, only cell instances containing parameters 330-332 are shown in assignment-management mechanism 304. On the other hand, if none of the parameters in parameter-display mechanism 302 is selected, assignment-management mechanism 304 may include an additional column for net assignments to parameter 328 (e.g., "vdd"). If only one parameter is selected, assignment-management mechanism 304 may omit column 312 and display net assignments to the selected parameter in column 310.

As mentioned previously, the background color and/or font style of each net assignment may be set based at least on an assignment state of the associated parameter in a cell instance. A gray background color may indicate that the cell instance does not contain the parameter, and hence, no net assignment exists for the parameter in the cell instance. For example, rows 316-318 and 324-326 contain a gray background in column 310, denoting that the "sym2," "sym3," "sym6," and "sym7" cell instances do not include the "bulk_n" parameter (e.g., parameter 330). Similarly, rows 314 and 320-322 contain a gray background in column 312, thus showing a lack of the "main" parameter (e.g., parameter 332) in the "sym1," "sym4," and "sym5" cell instances.

A white background color may represent an empty assignment state of a parameter, in which the parameter is not explicitly assigned for any components within the cell instance. Within assignment-management mechanism 304, row 314 of column 310 and rows 316-318 of column 312 include a white background. Moreover, row 314 of column 310 shows italicized text (e.g., "gnd!"), while rows 316-318 of column 312 show text in a normal font style. The italicized text in row 314 may represent a default net assignment for parameter 330 to the "gnd!" net and a lack of an explicit net assignment for the "sym1" cell instance. In other words, the contents of the entry in row 314 and column 310 may show that the "sym1" cell instance and all components (e.g., lower-level cell instances) associated with the "bulk_n" parameter within the "sym1" cell instance have a default net assignment of "bulk_n" to "gnd!"

The normal font style of "mynet" in row 316 of column 312 may indicate that the "sym2" cell instance includes an explicit net assignment of the "main" parameter to the "mynet" net. Although row 318 of column 312 also displays "new: mypwr!" in a normal font style, the presence of a colon specifies that the "sym3" cell instance includes an override parameterization of the "main" parameter to a "new" parameter with a default value of "mypwr!" In other words, a net assignment in a normal font style that lacks a colon may represent an explicit net assignment, while a net assignment with a colon may represent the creation of a different parameter in the cell instance, with the created parameter's name to the left of the colon and the created parameter's default value to the right of the colon.

A yellow background may represent a partially assigned assignment state of a parameter, in which the parameter is assigned for some components in a cell instance. As shown in FIG. 3, rows 320-322 of column 310 include a yellow background. As with row 314, row 320 contains "gnd!" in italics, signifying that the "sym4" cell instance includes a default net assignment of the "bulk_n" parameter to the "gnd!" net. However, because row 314 indicates that the "bulk_n" parameter is partially assigned in the "sym4" cell instance, one or more components in the "sym4" cell instance may include a net assignment of "bulk_n" to a value other than "gnd!" Along the same lines, row 322 contains "mynet" in a normal font style, indicating that the net assignment of "bulk_n" in the "sym5" cell instance is explicitly set to "mynet." Furthermore, the explicit net assignment in "sym5" may affect only the components in "sym5" that do not already have explicit net assignments. Explicit net assignments in cell instances may thus block net assignments that are made in higher levels of the hierarchy.

Finally, a red background may represent a fully assigned assignment state of a parameter, in which the parameter is assigned for all components associated with the parameter in a cell instance. Because rows 324-326 of column 312 have red backgrounds, the "sym6" and "sym7" cell instances may contain components that are all explicitly assigned with respect to the "main" parameter. Consequently, attempts to assign the "main" parameter in "sym6" and "sym7" may not affect connectivity in the components; "sym6" does not contain a net assignment, while "sym7" contains an attempted net assignment to the "badnet" net. Moreover, the ineffectiveness of the attempted net assignment may result in the display of "badnet" in bold. In other words, bold text in assignment-management mechanism 304 may signify problems associated with fully assigned parameters.

As discussed above, the GUI may also enable modifications to the net assignments by the user. In particular, columns 310-312 may contain editable fields. The user may modify a net assignment by selecting an editable field corresponding to the net assignment and changing the value within the editable field. For example, the user may enter "mynet" and "gnd" into rows 316 and 326 of column 312 in an attempt to change net assignments in the "sym2" and "sym7" cell instances. If an entered value is valid, the value may be displayed in a normal font style (e.g., "mynet") and the change represented by the value made. Alternatively, the value may be displayed in bold if the net assignment is to a fully assigned parameter in the cell instance. Moreover, if an entered value is invalid (e.g., does not represent a net name or a override parameterization), the attempted change represented by the value may be ignored or flagged. For example, if the user enters an invalid net name of "mynett" instead of a valid net name of "mynet" into row 314 of column 310, the GUI may display a dialog box informing the user that "mynett" is an invalid entry and continue displaying the previous value in row 314 of column 310 (e.g., "gnd!").

The GUI may additionally allow the user to view parameters and assignments associated with different levels of the hierarchy. In particular, the user may select a button 334 when a cell instance is selected within assignment-management mechanism 304 to descend to the level below the cell instance in the hierarchy. Parameters and net assignments displayed within the GUI may be updated to reflect the lower level. To reach higher levels of the hierarchy, the user may select button 336 or button 338. Button 336 may allow the user to view connection definition information for the level higher than the current level displayed in the GUI, while button 338 may allow the user to view connection definition information for the highest level of the hierarchy. Consequently, the GUI of FIG. 3 may allow the user to manage parameterized connections in the design by navigating and/or traversing the hierarchy of the design and viewing and/or modifying net assignments at different levels of the hierarchy.

The GUI of FIG. 3 may also display other information to facilitate the management of parameterized connections in the design. For example, parameter-display mechanism 302 may include a list of all connection definitions of parameters 328-332 (e.g., terminals) in the entire hierarchy of the design. Each connection definition may include a parameter (e.g., parameters 328-332), an object (e.g., net, terminal) containing the parameter, and a default net assignment for the parameter. The user may edit the connection definition by selecting the connection definition in parameter-display mechanism 302.

Similarly, assignment-management mechanism 304 may display a list of explicit net assignments in components within a selected cell instance to the user. Each explicit net assignment may include a master of the component containing the net assignment, an object associated with the net assignment, and a value of the net assignment. Because explicit net assignments may block changes to net assignments for the cell instance, the "blocking assignment" list may allow the user to determine which net assignments are affected by the changes and which assignments are blocking the changes. The user may select a net assignment in the "blocking assignment" list to change the view within the GUI to the level containing the net assignment and/or to edit the net assignment.

Figure 4:
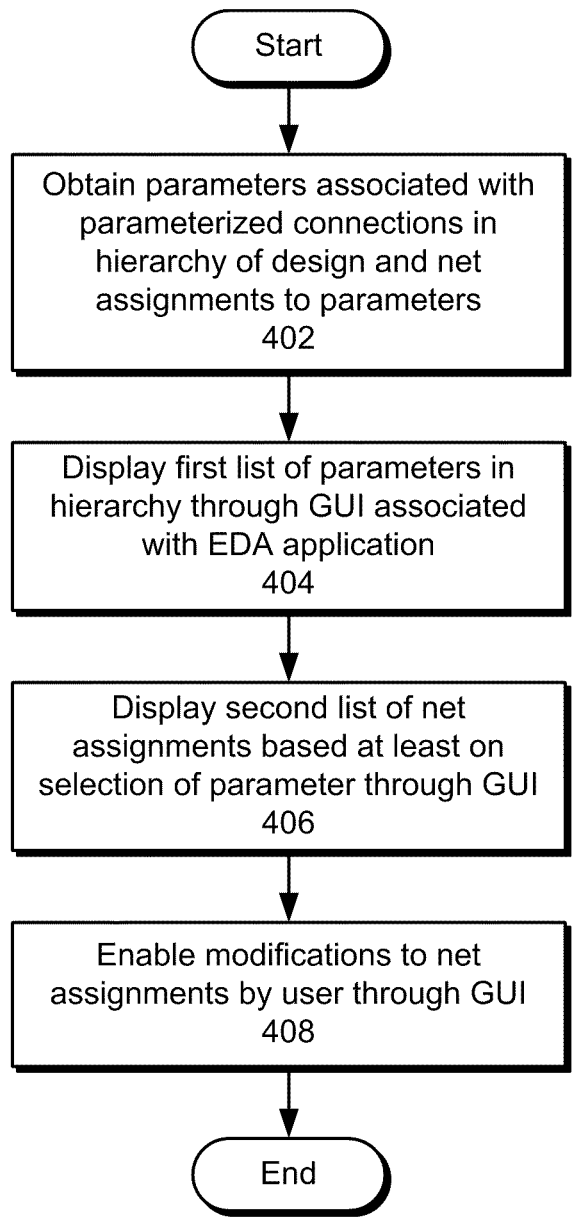
FIG. 4 shows a flowchart illustrating the process of facilitating the creation of a design in an EDA application in accordance with an embodiment.

FIG. 4 shows a flowchart illustrating the process of facilitating the creation of a design in an EDA application in accordance with an embodiment. In one or more embodiments, one or more of the steps may be omitted, repeated, and/or performed in a different order. Accordingly, the specific arrangement of steps shown in FIG. 4 should not be construed as limiting the scope of the embodiments.

First, a set of parameters associated with parameterized connections in a hierarchy of the design and a set of net assignments to the parameters is obtained (operation 402). The parameters and net assignments may be associated with a specific level of the hierarchy. Next, a first list of the parameters in the hierarchy is displayed through a GUI associated with the EDA application (operation 404). The parameters may be displayed in a parameter-display mechanism, such as parameter-display mechanism 302 of FIG. 3.

A second list of the net assignments is also displayed based at least on a selection of a parameter through the GUI (operation 406). If the parameter is selected, a subset of cell instances and net assignments associated with the parameter is displayed. If no parameter is selected, all cell instances and net assignments associated with the parameters are displayed. The background color and/or font style of each net assignment may also be set based at least on an assignment state of the corresponding parameter. For example, a white background color may correspond to an empty assignment state, in which the parameter is not assigned for any component in the cell instance. A yellow background may correspond to a partially assigned assignment state, in which the parameter is assigned for some components in the cell instance. Finally, a red background may correspond to a fully assigned assignment state, in which the parameter is assigned for all components associated with the parameter in the cell instance.

Modifications to the net assignments by the user are enabled through the GUI (operation 408). For example, the list of net assignments may contain editable fields. To change the value of a net assignment, the user may select the corresponding editable field and modify the value within the editable field. If the value is valid, the value may be displayed in a normal font style. If the value is invalid, the value may be displayed in bold.

Figure 5:
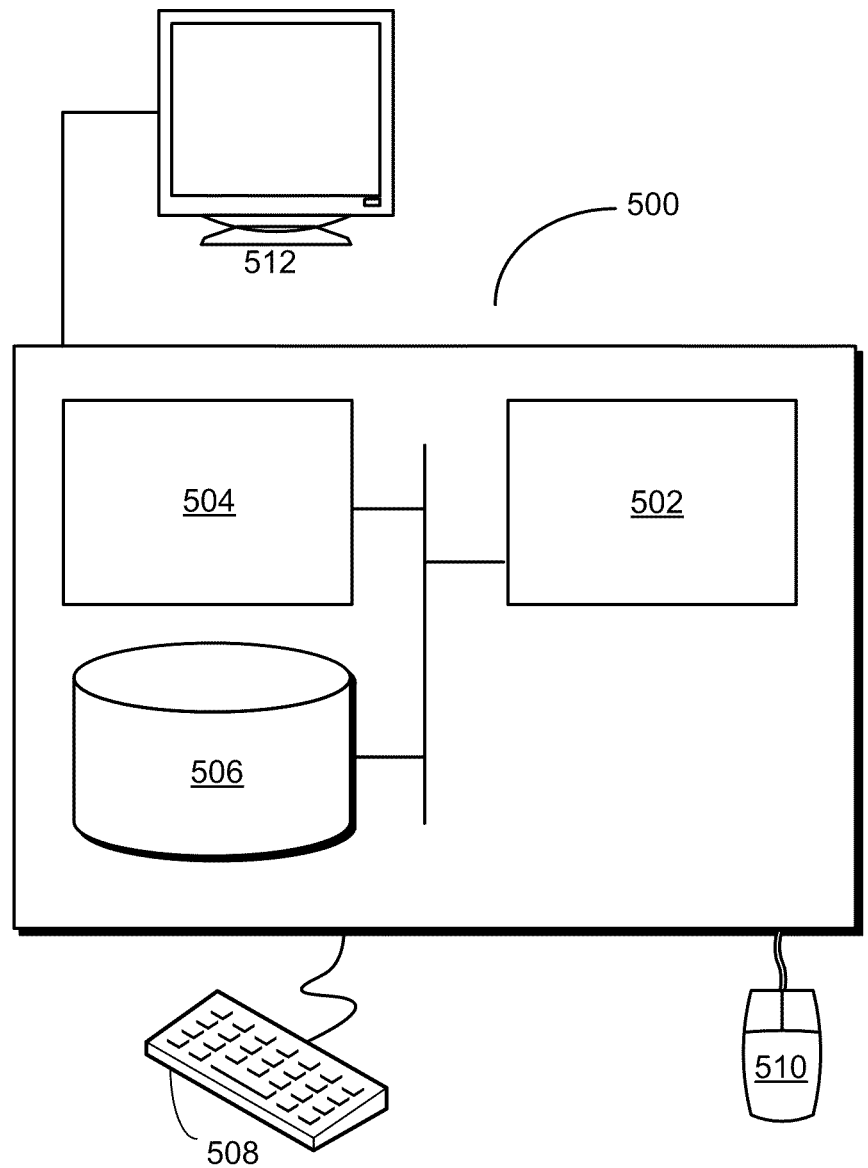
FIG. 5 shows a computer system in accordance with an embodiment.

FIG. 5 shows a computer system 500 in accordance with an embodiment. Computer system 500 includes a processor 502, memory 504, storage 506, and/or other components found in electronic computing devices. Processor 502 may support parallel processing and/or multi-threaded operation with other processors in computer system 500. Computer system 500 may also include input/output (I/O) devices such as a keyboard 508, a mouse 510, and a display 512.

Computer system 500 may include functionality to execute various components of the present embodiments. In particular, computer system 500 may include an operating system (not shown) that coordinates the use of hardware and software resources on computer system 500, as well as one or more applications that perform specialized tasks for the user. To perform tasks for the user, applications may obtain the use of hardware resources on computer system 500 from the operating system, as well as interact with the user through a hardware and/or software framework provided by the operating system.

In one or more embodiments, computer system 500 provides a system for facilitating the creation of a design within an EDA application. The system may include a connection-analysis apparatus that obtains a set of parameters associated with parameterized connections in a hierarchy of the design and a set of net assignments to the parameters. The system may also include a GUI that displays the parameters and the net assignments to a user of the EDA application and enables modifications to the net assignments by the user.

In addition, one or more components of computer system 500 may be remotely located and connected to the other components over a network. Portions of the present embodiments (e.g., GUI, connection-analysis, etc.) may also be located on different nodes of a distributed system that implements the embodiments. For example, the present embodiments may be implemented using a cloud computing system that allows enables the creation of designs on a remote EDA application.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for facilitating creation of a design in an electronic design automation (EDA) application, comprising:
   obtaining a set of parameters associated with parameterized connections in a hierarchy of the design and a set of net assignments to the parameters;
   displaying the parameters and the net assignments to a user of the EDA application through a table in a graphical user interface (GUI) associated with the EDA application, wherein an element in the table indicates an assignment state of a parameter in the hierarchy of the design, wherein the assignment state is one of:

empty, partially assigned, and fully assigned; and
enabling the user to modify connectivity of the design by modifying the net assignments in the table.

2. The computer-implemented method of claim 1, wherein obtaining the parameters and the assignments involves:
retrieving connection definition information for the design based at least on the hierarchy, wherein the connection definition information comprises the parameters and the net assignments.

3. The computer-implemented method of claim 1,
wherein each of the parameters is associated with one or more cell instances, and
wherein a cell instance from the cell instances is electrically connected to a net if the cell instance contains a net assignment of one of the parameters to the net.

4. The computer-implemented method of claim 3, wherein displaying the parameters and the net assignments through the GUI involves:
displaying a first list of the parameters in the hierarchy; and
displaying a second list of the net assignments based at least on a selection of a parameter from the parameters through the GUI.

5. The computer-implemented method of claim 4, wherein displaying the second list of the net assignments based at least on the selection of the parameter involves:
displaying a subset of the cell instances and a subset of the net assignments associated with the parameter if the parameter is selected; and
displaying all of the cell instances and all of the net assignments if none of the parameters is selected.

6. The computer-implemented method of claim 4, wherein displaying the second list of the net assignments based at least on the selection of the parameter involves:
setting a background color or a font style of each net assignment from the net assignments based at least on the assignment state of the parameter.

7. A system for facilitating creation of a design in an electronic design automation (EDA) application, comprising:
a connection-analysis apparatus configured to obtain a set of parameters associated with parameterized connections in a hierarchy of the design and a set of net assignments to the parameters; and
a graphical user interface (GUI) configured to:
display the parameters and the net assignments to a user of the EDA application through a table, wherein an element in the table indicates an assignment state of a parameter in the hierarchy of the design, wherein the assignment state is one of: empty, partially assigned, and fully assigned; and
enable the user to modify connectivity of the design by modifying the net assignments in the table.

8. The system of claim 7, wherein obtaining the parameters and the net assignments involves:
retrieving connection definition information for the design based at least on the hierarchy, wherein the connection definition information comprises the parameters and the net assignments.

9. The system of claim 7,
wherein each of the parameters is associated with one or more cell instances, and
wherein a cell instance from the cell instances is electrically connected to a net if the cell instance contains a net assignment of one of the parameters to the net.

10. The system of claim 9, wherein displaying the parameters and the net assignments through the GUI involves:
displaying a first list of the parameters in the hierarchy; and
displaying a second list of the net assignments based at least on a selection of a parameter from the parameters through the GUI.

11. The system of claim 10, wherein displaying the second list of the net assignments based at least on the selection of the parameter involves:
displaying a subset of the cell instances and a subset of the net assignments associated with the parameter if the parameter is selected; and
displaying all of the cell instances and all of the net assignments if none of the parameters is selected.

12. The system of claim 10, wherein displaying the second list of the net assignments based at least on the selection of the parameter involves:
setting a background color or a font style of each net assignment from the net assignments based at least on the assignment state of the parameter.

13. A non-transitory computer-readable storage medium storing instructions that when executed by a computer cause the computer to perform a method for facilitating creation of a design in an electronic design automation (EDA) application, the method comprising:
obtaining a set of parameters associated with parameterized connections in a hierarchy of the design and a set of net assignments to the parameters;
displaying the parameters and the net assignments to a user of the EDA application through a table in a graphical user interface (GUI) associated with the EDA application, wherein an element in the table indicates an assignment state of a parameter in the hierarchy of the design, wherein the assignment state is one of:
empty, partially assigned, and fully assigned; and
enabling the user to modify connectivity of the design by modifying the net assignments in the table.

14. The non-transitory computer-readable storage medium of claim 13, wherein obtaining the parameters and the net assignments involves:
retrieving connection definition information for the design based at least on the hierarchy, wherein the connection definition information comprises the parameters and the net assignments.

15. The non-transitory computer-readable storage medium of claim 13,
wherein each of the parameters is associated with one or more cell instances, and
wherein a cell instance from the cell instances is electrically connected to a net if the cell instance contains a net assignment of one of the parameters to the net.

16. The non-transitory computer-readable storage medium of claim 15, wherein displaying the parameters and the net assignments through the GUI involves:
displaying a first list of the parameters in the hierarchy; and
displaying a second list of the net assignments based at least on a selection of a parameter from the parameters through the GUI.

17. The non-transitory computer-readable storage medium of claim 16, wherein displaying the second list of the net assignments based at least on the selection of the parameter involves:
displaying a subset of the cell instances and a subset of the net assignments associated with the parameter if the parameter is selected; and
displaying all of the cell instances and all of the net assignments if none of the parameters is selected.

18. The non-transitory computer-readable storage medium of claim 16, wherein displaying the second list of the net assignments based at least on the selection of the parameter involves:

setting a background color or a font style of each net assignment from the net assignments based at least on the assignment state of the parameter.

19. A graphical user interface (GUI) for facilitating creation of a design in an electronic design automation (EDA) application, comprising:

a parameter-display mechanism that displays a first list of parameters in a hierarchy of the design; and an assignment-management mechanism that displays a second list of net assignments to the parameters through a table based at least on a selection of a parameter from the parameters through the parameter-display mechanism, wherein an element in the table indicates an assignment state of the parameter in the hierarchy of the design, the assignment state comprising one of: empty, partially assigned, and fully assigned.

20. The GUI of claim 19, wherein the net assignment-management mechanism enables modifications to the net assignments by a user of the EDA application.

21. The GUI of claim 19, wherein displaying the second list of the net assignments based at least on the selection of the parameter involves:

displaying a subset of the cell instances and a subset of the net assignments associated with the parameter if the parameter is selected; and displaying all of the cell instances and all of the net assignments if none of the parameters is selected.

22. The GUI of claim 19, wherein displaying the second list of the net assignments based at least on the selection of the parameter involves:

setting a background color or a font style of each net assignment from the net assignments based at least on the assignment state of the net assignment.

* * * * *